United States Patent [19]

Sukegawa et al.

[11] Patent Number: 5,422,850
[45] Date of Patent: Jun. 6, 1995

[54] SEMICONDUCTOR MEMORY DEVICE AND DEFECTIVE MEMORY CELL REPAIR CIRCUIT

[75] Inventors: Shunichi Sukegawa, Oume; Tetsuya Saeki, Tachikawa, both of Japan

[73] Assignees: Texas Instruments Incorporated, Dallas, Tex.; Hitachi Ltd., Japan

[21] Appl. No.: 90,450

[22] Filed: Jul. 12, 1993

[51] Int. Cl.⁶ .............................. G11C 11/40
[52] U.S. Cl. ...................... 365/200; 365/225.7; 365/230.06; 365/230.02; 326/13; 327/526
[58] Field of Search ............... 365/200, 225.7, 230.06, 365/230.02; 307/449, 463, 441, 219

[56] References Cited

U.S. PATENT DOCUMENTS 4,773,046  9/1988  Akaogi et al. ............... 365/207
5,262,994  11/1993  McClure ........................ 365/200

Primary Examiner—Joseph A. Popek
Assistant Examiner—Huan Hoang
Attorney, Agent, or Firm—William E. Hiller; Richard L. Donaldson

[57] ABSTRACT

To provide a type of semiconductor memory device characterized by the fact that the redundancy for the defective memory of defective bits is increased and the area occupied by the redundant memory address decoder on the chip is minimized, thereby reducing the cost of the semiconductor memory device. It has multiple fuse decoders which are commonly connected to the address bus and are programmed for the different addresses, and it has a redundant address decoder which detects coincidence/uncoincidence between the outputs of the two decoders and generates a redundant address coincidence signal, so as to increase the efficiency in repairing the defective memory.

7 Claims, 15 Drawing Sheets

|  | $X_1$ | | $X_4$ | |
|---|---|---|---|---|
| PADs | PINs | PAD.NAME | PINs | PAD.NAME |
| 1 | 34 | VSS.SDN7 | 34 | VSS.SDN7 |
| 2 | 1 | VDD.SDP7 | 1 | VDD.SDP7 |
| 3 | 1 | VDD.DO4 | 1 | VDD.DO4 |
| 4 | 34 | VSS.DO4 | 34 | VSS.DO4 |
| 5 | . | . | . | . |
| 6 | 33 | O | 33 | DOo |
| 7 | 2 | D | 2 | DOo |
| 8 | . | . | . | . |
| 9 | . | . | . | . |
| 10 | . | . | 32 | DO2 |
| 11 | . | . | 3 | DO1 |
| 12 | . | . | . | . |
| 13 | 34 | VSS.DO3 | 34 | VSS.DO3 |
| 14 | 1 | VDD.DO3 | 1 | VDD.DO3 |
| 15 | 34 | VSS4 | 34 | VSS4 |
| 16 | 1 | VDD4 | 1 | VDD4 |
| 17 | 34 | VSS.SDN6 | 34 | VSS.SDN6 |
| 18 | 1 | VDD.SDP6 | 1 | VDD.SDP6 |
| 19 | 1 | VDD.SDP5 | 1 | VDD.SDP5 |
| 20 | 34 | VSS.SDN5 | 34 | VSS.SDN5 |
| 21 | 1 | VDD3 | 1 | VDD3 |
| 22 | 34 | VSS3 | 34 | VSS3 |
| 23 | 34 | VSS.DO2 | 34 | VSS.DO2 |
| 24 | 1 | VDD.DO2 | 1 | VDD.DO2 |
| 25 | . | . | . | . |
| 26 | . | . | . | . |
| 27 | . | . | . | . |
| 28 | . | . | . | . |
| 29 | . | . | . | . |
| 30 | . | . | . | . |
| 31 | . | . | . | . |
| 32 | . | . | . | . |
| 33 | 34 | VSS.DO1 | 34 | VSS.DO1 |
| 34 | 1 | VDD.DO1 | 1 | VDD.DO1 |
| 35 | . | . | . | . |
| 36 | . | . | . | . |

| | | | | |
|---|---|---|---|---|
| 37 | 34 | VSS.SDN4 | 34 | VSS.SDN4 |
| 38 | 1 | VDD.SDP4 | 1 | VDD.SDP4 |
| 39 | . | . | 1/54 | BND.OPT |
| 40 | | | 1/54 | BND.OPT |
| 41 | 1 | VDD(/LCE) | 1 | VDD(/LCE) |
| 42 | 28 | /CE | 28 | /CE |
| 43 | 8 | /W | 8 | /W |
| 44 | 27 | /OE | 27 | /OE |
| 45 | 9 | /RE | 9 | /RE |
| 46 | (26) | VPP.MNTR | (26) | VPP.MNTR |
| 47 | . | . | . | . |
| 48 | . | . | . | . |
| 49 | . | . | . | . |
| 50 | | | | |
| 51 | 1 | VDD2 | 1 | VDD2 |
| 52 | . | | . | |
| 53 | 25 | A12 | 25 | A12 |
| 54 | 11 | A0 | 11 | A0 |
| 55 | 24 | A11 | 24 | A11 |
| 56 | 34 | VSS.SDN3 | 34 | VSS.SDN3 |
| 57 | 1 | VDD.SDP3 | 1 | VDD.SDP3 |
| 58 | 1 | VDD.SDP2 | 1 | VDD.SDP2 |
| 59 | 34 | VSS.SDN2 | 34 | VSS.SDN2 |
| 60 | 12 | A1 | 12 | A1 |
| 61 | 23 | A10 | 23 | A10 |
| 62 | 13 | A2 | 13 | A2 |
| 63 | 22 | A9 | 22 | A9 |
| 64 | 14 | A3 | 14 | A3 |
| 65 | 21 | A8 | 21 | A8 |
| 66 | 15 | A4 | 15 | A4 |
| 67 | 20 | A7 | 20 | A7 |
| 68 | 16 | A5 | 16 | A5 |
| 69 | 19 | A6 | 19 | A6 |
| 70 | 34 | VSS1 | 34 | VSS1 |
| 71 | 1 | VDD1 | 1 | VDD1 |
| 72 | 34 | VSSIN1 | 34 | VSSIN1 |
| 73 | 1 | VDDIN1 | 1 | VDDIN1 |
| 74 | 1 | VDD.SDP1 | 1 | VDD.SDP1 |
| 75 | 34 | VSS.SDN1 | 34 | VSS.SDN1 |

X( ROW ADDRESS )=0~9
U( RED. X FACT # )=0~3
V( CR DECODER )=0~2
N( ONE FOR 2 RRA CKTS )=0~4

SEMICONDUCTOR MEMORY DEVICE AND DEFECTIVE MEMORY CELL REPAIR CIRCUIT

This invention pertains to a type of IC. More specifically, this invention pertains to a type of IC device formed on a semiconductor substrate, such as dynamic random access memory or other memory device.

PRIOR ART

The rapid development of the dynamic random access memory DRAM as a type of large-scale IC semiconductor device is well-known, such as the development from the 16K DRAM disclosed by Rao in U.S. Pat. No. 4,055,444 to the 1M DRAM disclosed by McElroy in U.S. Pat. No. 4,658,377, and further to 4M and 16M DRAM. At present, the 64M DRAM, which has more than 64 million memory cells and their peripheral circuitry formed on a single chip, is in the prototype phase, and plans are to mass produce it as the next-generation DRAM. At present, the designers of the 64M DRAM ultra-large scale IC (ULSI) semiconductor memory device are facing many problems. For example, one of the features concerned is to eliminate defective memory cells. As indicated by the planar capacitor cell disclosed in U.S. Pat. No. 4,240,092 by Kuo and the trench capacitor cell disclosed by Baglee et al. in U.S. Pat. No. 4,721,987, the development of the ultra-large scale DRAM is promoted by the reduction in the memory cell geometry. For the 64M DRAM or for even a higher level of integration, the geometry is extremely small, and submicron technology (less than one-millionth of meter) must be used for manufacturing. Consequently, the percentage of defective circuits and devices caused by particles, which were not formerly a serious problem in conventional manufacturing, will increase for such minute geometry.

FIG. 1 shows a 64M bits dynamic random access memory chip known as 64M DRAM prepared using submicron technology. This chip is equally divided into eight quadrants of 8M bits. Each of the eight memory quadrants contains eight 1M bits memory blocks. Each memory block is made of two 512K bits portions. The column decoder (C. dec) is set at the center of each memory quadrant along the axial line in the longitudinal direction as viewed from above. Row decoder (R. dec) is set along the axial line in the transverse direction of the chip adjacent to the corresponding memory quadrant. The peripheral circuit containing input/output buffer (A. buffer, I/O buffer), timing generator (S. R. timer, Row. clock) and control circuit (Row red.) is set at the central portion along both the horizontal axis and vertical axis of the chip. In addition, the bonding pad is placed at the center along the vertical axis of the chip.

FIGS. 2a and 2b show a chip having 75 bonding pads, with the assignment selectable between x1 and x4 options. The external lead terminals are set extended to the vicinity of these bonding pads. By using a conventional chip-on-lead configuration, connection is made by using gold wires, etc., to the bonding pads for power source $V_{DD}$ and $V_{SS}$ arranged at a number of locations by means of a bus bar arranged at the center. Consequently, a uniform potential can be fed to the entire chip. In addition, the configuration with multiple bonding pads of address signals set adjacent to each other is preferred for the function of the decoders. However, since there is a significant distance between address signal A12 of bonding pad 53 and A6 of bonding pad 69, by the time the address signal arrives the decoder circuit has been delayed by about 0.8 nsec. This delay has a major influence on the timing adjustment of the decoder. In addition, FIG. 3 shows the layout of the external terminals of the 28 pins connected to these bonding pads. 75 bonding pads are arranged for the 28 terminals. This is for setting the plurality of bonding pads for the power source as explained above, and to anticipate the demand of packages with more pins, such as the 64-pin or other SOJ packages. In order to further improve the yield of the chip shown in FIG. 1, more precise fine processing may be performed, or the circuit adopted in the initial stage of chip development may be abandoned during mass production. In this case, an improved version with a reduced amount of redundant memory and removal of the peripheral pump circuit may be used to replace the aforementioned initial version. In this case, the bonding pads are densely arranged at the central portion. Consequently, there is no need to redesign the lead frame. This is beneficial for cutting development costs. In FIG. 1, most of the bonding pads are not shown in order to simplify the explanation. In the practice, however, there exist many bonding pads as shown in FIGS. 2a and 2b.

When a product is judged defective by a multiprobe for the semiconductor wafer before it is cut into multiple chips, the defective chip is identified from the other chips and is disposed of. The same disposal operation is performed when the device is found to be electrically defective in the inspection after assembly of the device. Consequently, it is necessary to replace the defective memory or defect-related memory with other memory cells which are known as redundant circuitry. When defective memory is detected by the multiprobe tester, the address corresponding to this memory is recorded and replaced by a redundant memory cell before the memory containing the defective cell is used. This means can be realized by burning fuses. Use of the redundant memory and generation of the coincidence signal of the defective memory's address are very important for determining the overall performance of the device. That is, compared to the case of access to conventional memory, when accessing the replacement redundant memory the speed is slower, and this degraded specification determines the performance of the device. Also, the performance of the device degrades when excessive power is consumed by using the redundant memory. Consequently, the configuration of the redundant circuit, in particular, the address coincidence signal generating circuit forms a portion of the DRAM, and use of the redundant circuit is denoted as an inherent specification for the devices and systems.

FIG. 4 shows a conventional address coincidence circuit. It locates in the path between the transistor selected from multiple transistors and the common node between the transistors. According to conventional technology, a laser beam or high voltage is applied to burn a portion of the fuses corresponding to the prescribed address bits. The output of inverter 8 is used for sending out the signal associated with the redundant memory row. The gate of pull-up p-channel transistor 3 is connected to the output of inverter 5. The input of inverter 5 is connected to fuses 4 and the input of inverter 8. P-channel transistor 3 should only have a driving power sufficient for maintaining the potential at the node to which multiple fuses 4 are connected in common at the level of $V_{DD}$. Consequently, it may be formed with a small area. In the logic circuit shown in the left half of FIG. 4, address factors F0–F23 are output upon receiving input address unit signals A0–A11. These address factors are input into the inverters surrounded by the broken line 6. The circuit shown here can usually have a configuration with a small circuit area. On the other hand, in order to adjust the arrival time of the address signal, it is necessary to generate the coincidence signal at the time the address signals A12 and A13 farthest away from the decoder circuit are taken. Consequently, the operating speed is relatively low.

FIG. 5 shows the address coincidence circuit which can be used in the conventional 16M DRAM. The circuit for outputting the expected value "1" of the address unit signal is performed by burning fuses 164. Field-effect transistor 166 is connected to field-effect transistors 168, 170, and 172 in this configuration. In addition, these fuse circuits contain inverter 162 connected to fuse 164. One terminal of transistor 172 is used to receive the address unit signal, one terminal of transistor 170 is used to receive the complement of the address signal. Transistors 170 and 172 perform the operation at a threshold voltage lower than that of the other transistor as shown in FIG. 5. In order to start the redundant memory cell corresponding to the selected address, the fuse is burned when the address bit selected corresponding to the signal sent to transistor 172 has logic "1," that is, the high logic level. On the other hand, when the address bit corresponding to the signal sent to transistor 172 has logic "0," that is, the low logic level, the fuse is untouched. When fuse 164 is not burned, the gate of transistor 170 is energized and signal A on the terminal of transistor 170 is fed to the address factor. On the other hand, when fuse 164 is burned, the gate of transistor 172 is energized, and signal A is fed to the transistor factor. After the gate of transistor 166 receives the start pulse, the signals of address factors RA0–RA11 are generated, and each of them is input to one of the inverters 6. In order to start the redundant memory cell, all of address factors RA0–RA11 must be at logic "0," and a low logic level signal must be generated in the output of inverter 8. In this case, the program can be performed by burning fuse 164 in the circuit which adjusts the address unit signal. For this circuit, since the circuit for adjusting the address signal in the former stage is arranged corresponding to the address bit, the bit area increases. With the aid of the switching of transistors 170, 172 by the start pulse, the total address signal can be input into inverter 6 at the same time. Consequently, there is no need to adjust the timing precisely. As a result, it is suitable for high-speed operation.

In the following, the other purposes, advantages, and features of this invention will be explained in detail with reference to embodiments illustrated by figures in such a way as to be clear to specialists in the field.

The major topic for the aforementioned configuration of the address redundant coincidence circuit is to form a circuit on a small chip area which can output the redundant address coincidence signal stably at high speed; this requires a type of address redundant coincidence circuit which can make effective use of one redundant address row group.

In the configuration of the redundant address coincidence signal generating circuit of this invention, there are redundant address detecting circuits containing fuse decoder for repairing one defective bit and multiple fuse decoders for repairing other defective bits. In addition, there is the function of generating the redundant address coincidence signals in response to the output of these redundant address detecting circuits.

SUMMARY OF THE INVENTION

When the redundant address coincidence signal start circuit with the aforementioned configuration is started, the output of the redundant address detecting circuit having multiple redundant address decoders and the output of the other redundant address detecting circuit are received and the redundant address coincidence signal is generated; hence, the redundant address coincidence signal can be generated at high speed while the circuit area can be reduced.

Figure 1:
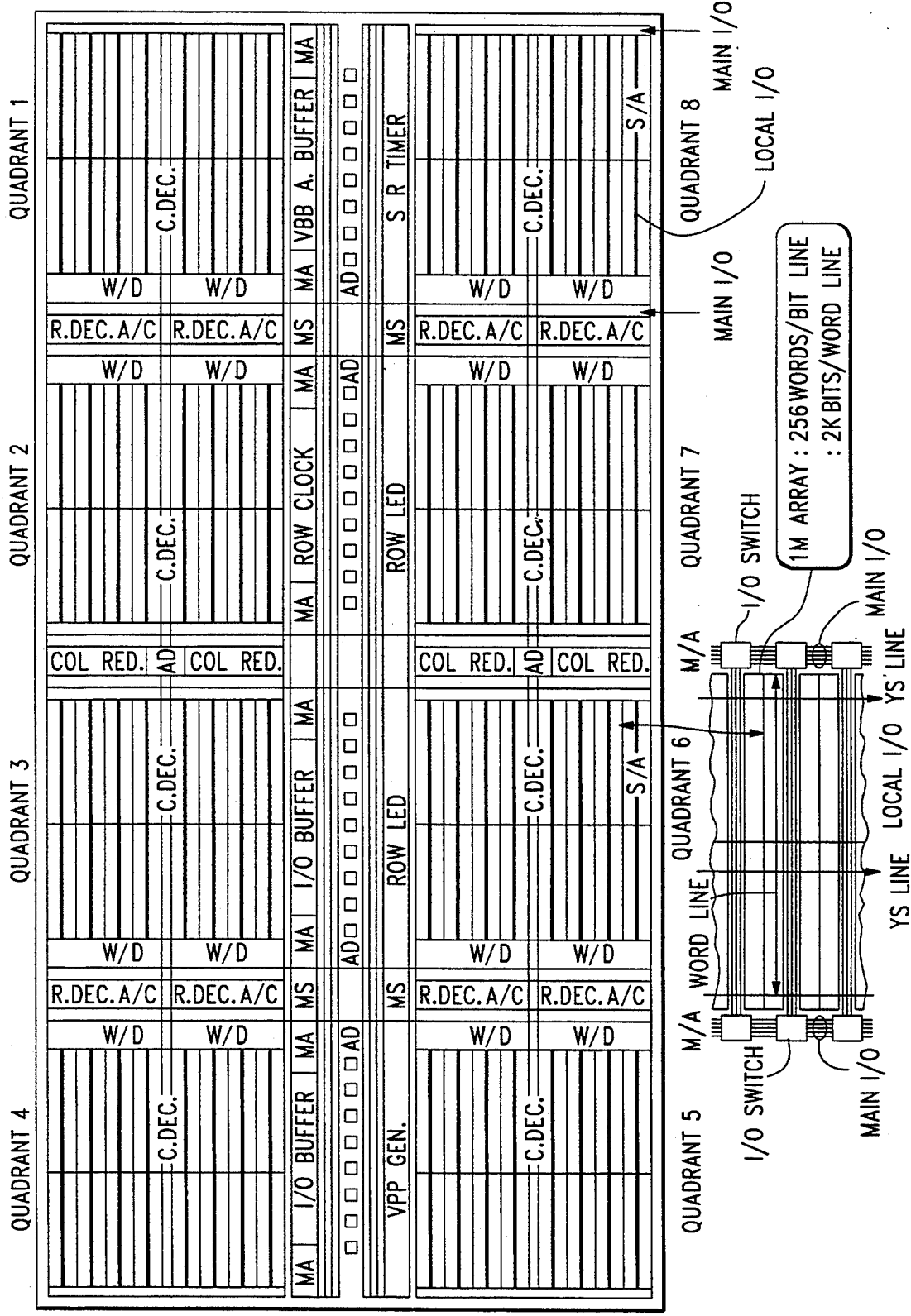
FIG. 1 is a plan view of the semiconductor memory chip.
Figure 2A:
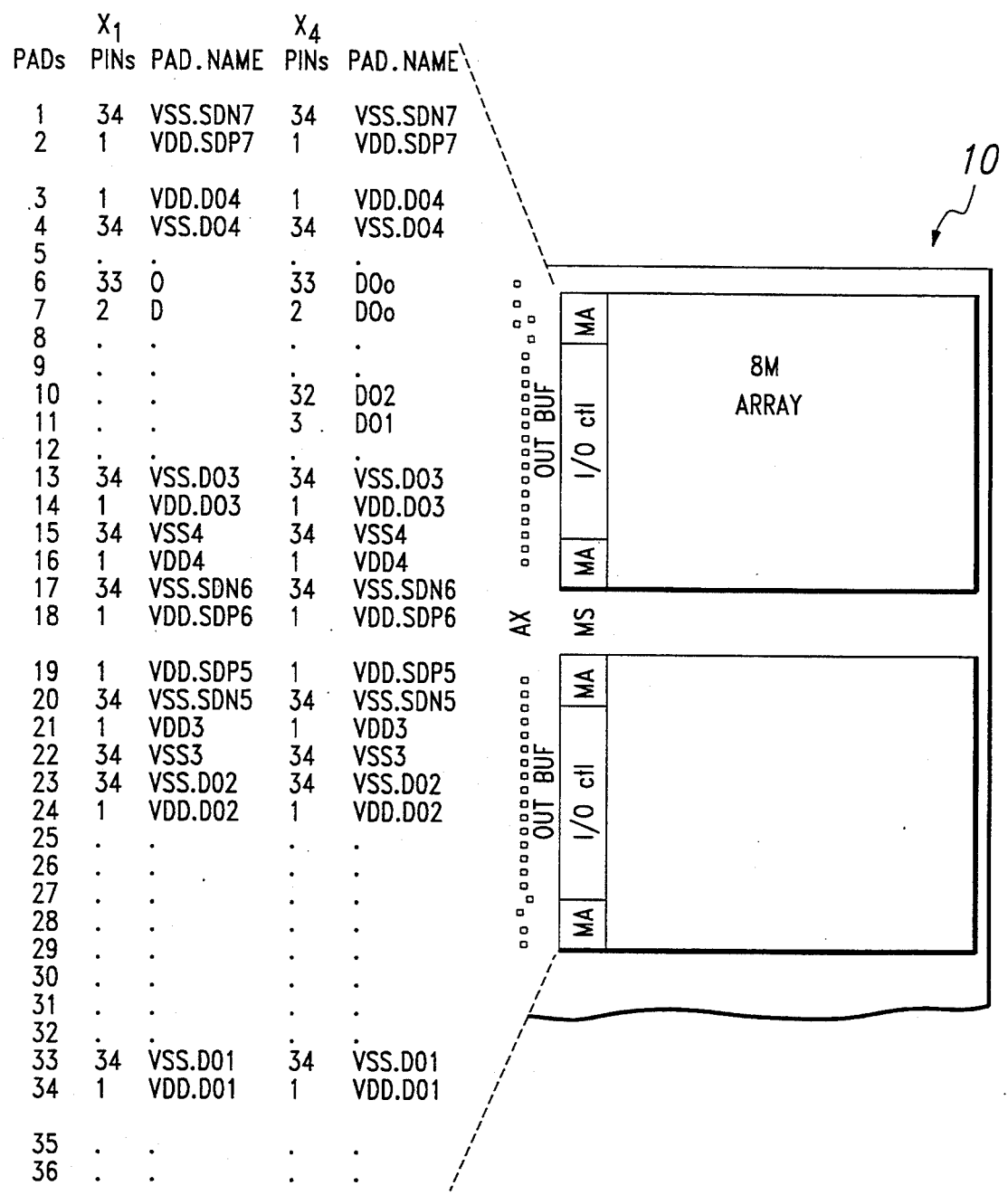
FIGS. 2a and 2b show the assignment of the bonding pad of the chip shown in FIG. 1.
Figure 2B:
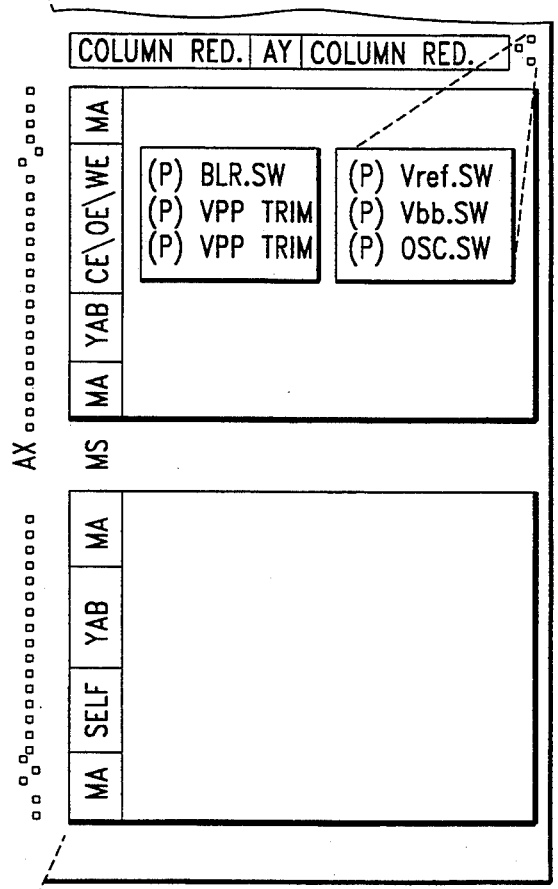
Figure 3:
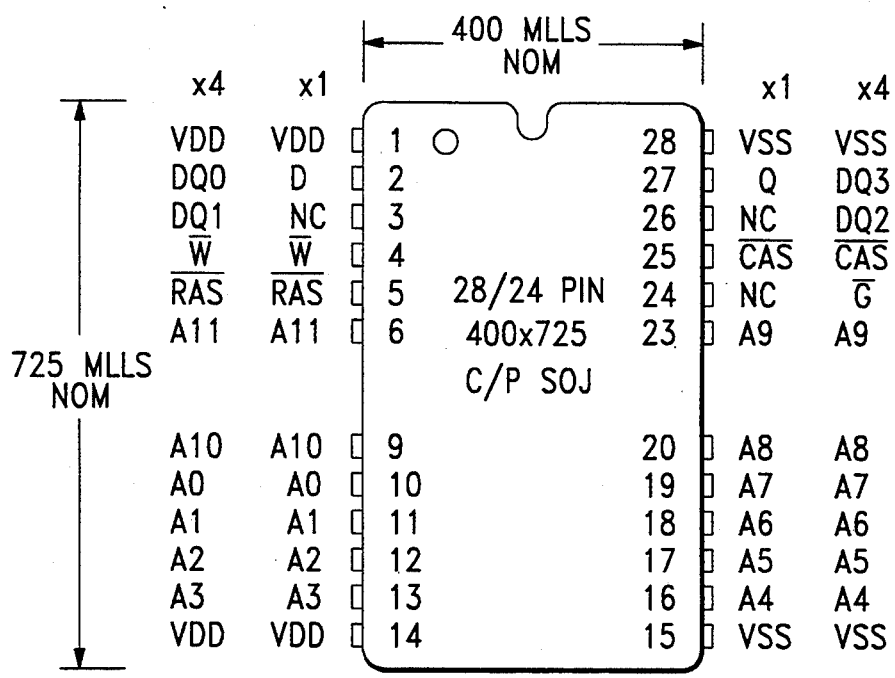
FIG. 3 shows the arrangement of the output pins of the semiconductor memory.
Figure 4:
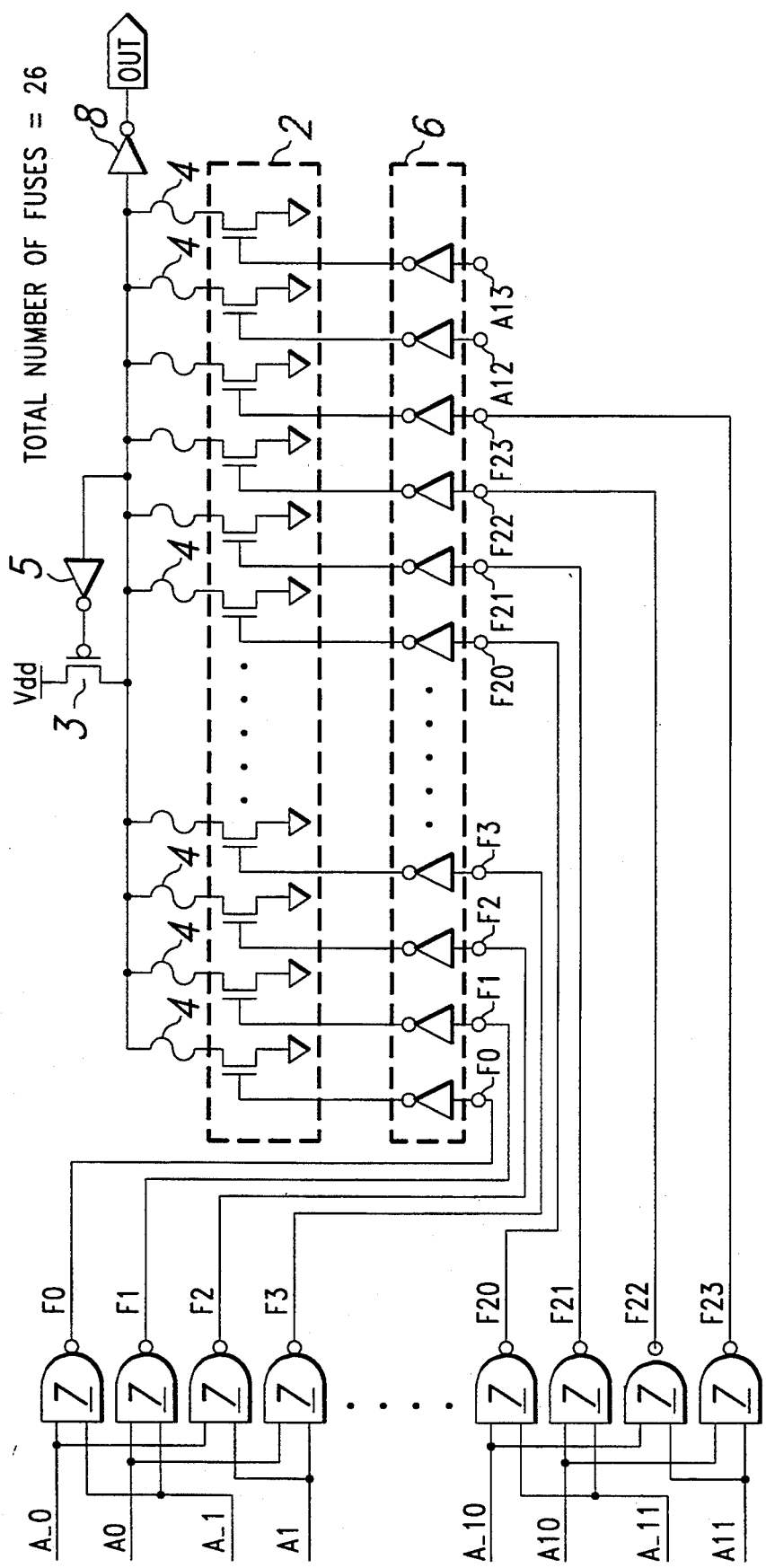
FIG. 4 shows a conventional address coincidence circuit.
Figure 5:
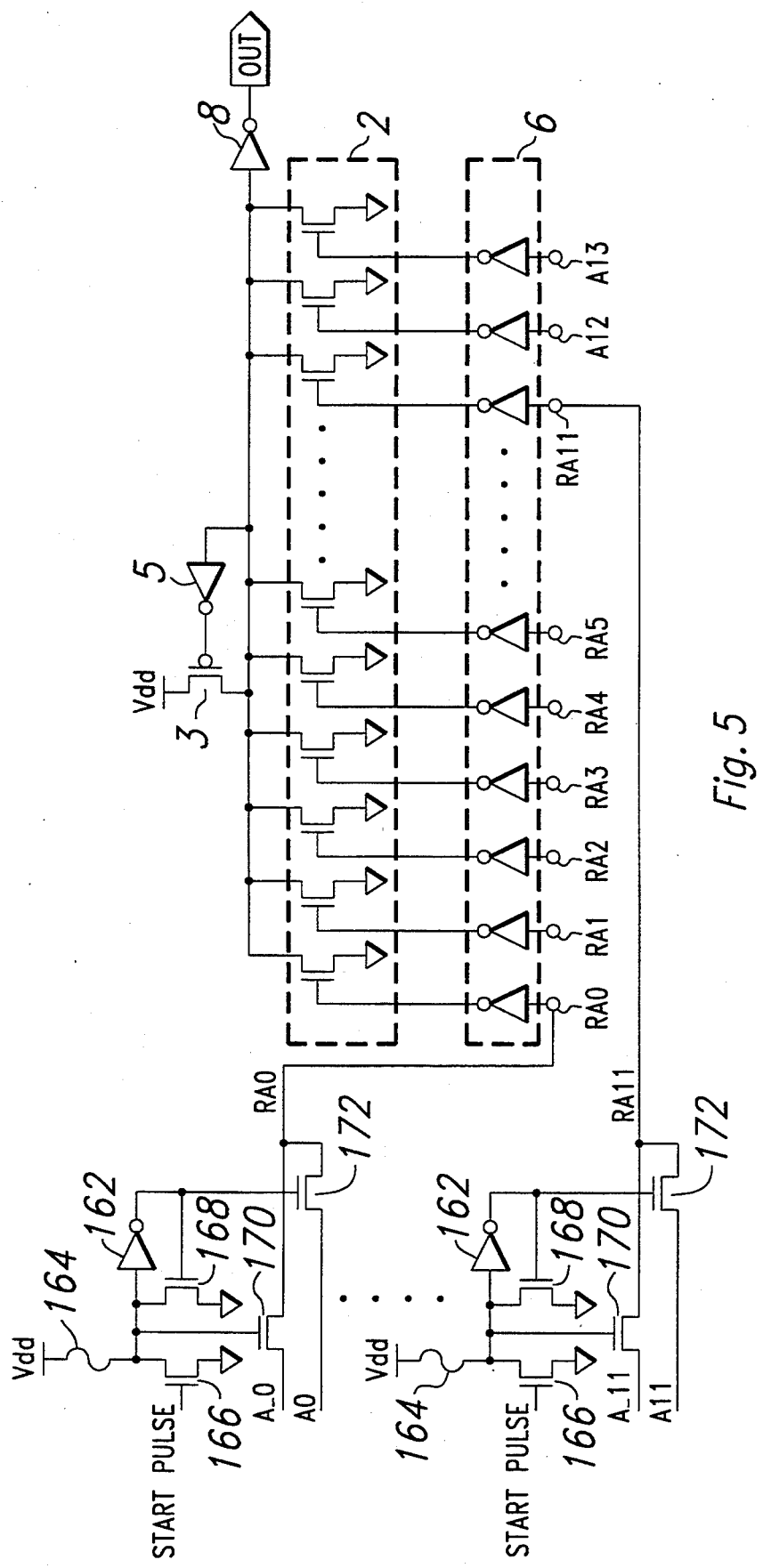
FIG. 5 shows the address coincidence circuit which may be used in the 16M DRAM.

In reference numerals as shown in the drawings:
2, transistor group
3, p-channel transistor
4,164, fuses
5,8,162, inverters
6, inverter group
7, "NAND" gate
10, semiconductor chip
166, 168, 170, 172, field-effect transistor
101, memory block
102, inverter group
103, fuse decoder
104, redundant address noncoincidence signal generator
105, redundant address coincidence signal generator
106, principal memory row group selection circuit
107, row line selection circuit
108, memory block selection circuit
111, main memory block
112, row line group selection circuit 113, row line selection circuit
202, defective memory
204, redundant memory
206, address bus
208, fuse decoder
210, inverter
212, fuse
214, 218, 219, 220, 221, 222, 223, transistors
216, redundant mechanism start transistor
224, address coincidence detection "NAND" gate
225, address noncoincidence detection "NOR" gate
226, address coincidence signal generating inverter
300, redundant energization line
302, redundant selection line
304, memory block
306, redundant row
308, predecoder
312, MS signal

TABLE I

| Type | Form of redundancy | Yield limit (block units) | Number of decoders | Number of redundant word lines |
|---|---|---|---|---|
| A | ANY TO ANY | 8 words/4M (32 decoders/32M) | 64 Decoders | 512 Lines |
| B | ANY TO ANY | 8 words/4M (32 decoders/32M) | 64 Decoders | 512 Lines |
| C | Fixed | 2 words/512K (2 decoders/2M) | 64 Decoders | 512 Lines |
| D | ANY TO ANY | 2 words/2M (2 decoders/16M) | 8 Decoders | 128 Lines |
| E | Semi-fixed | 4 words/512K (12 decoders/16M) | 12 Decoders | 128 Lines |

DESCRIPTION OF THE PREFERRED EMBODIMENTS

In an embodiment of this invention, the memory device consists of multiple memory arrays which have memory cells set in matrix form and which have redundant row groups for replacing the defective row group and a support circuit for reading information from the memory cell and for writing information into the memory cell. This support circuit contains a row redundant circuit which selects the redundant row of the memory cells only in the memory array having the defective row group of the memory cells in response to the defective row group address of the memory cells. It is preferred that the row redundant circuit contain a 2-stage row redundant decoder which can be programmed for holding the defective row address, and which allows programming by burning of fuses for keeping the information for identifying the memory array containing the defective row of the memory cell.

In another embodiment of this invention, the memory device integrated on a single semiconductor substrate consists of multiple memory arrays which have memory cells set in matrix form and a redundant column group of memory cells for replacing the defective column group, and column redundant circuit which selects the redundant column group of the memory cells only in the memory array having the defective column of the memory cells in response to the address of the defective column group of the memory cells. It is preferred that the column redundant circuit contain a column redundant decoder which can be programmed for keeping the defective address, and which allows 2-stage programming for holding the information for identifying the memory array containing the defective column of the memory cell. The memory device contains first redundant decoder which can be programmed to ensure holding of the address of the defective row, receiving of the row address, and generating the redundant row decoder signal and redundant row factor signal; a second redundant decoder which can be programmed to ensure holding the position of the array containing the defective row, receiving the redundant row decoder signal, and generating the array selection signal; and a redundant energization circuit which is connected to the redundant row factor energization signal of the first redundant decoder, the array selection signal of the second redundant decoder and the redundant row of the memory cells, and which generates a signal that energizes the selected redundant row of the memory cells in the memory array having the defective row of the memory cells.

According to this invention, the memory device may be a memory device and which contains row redundant and column redundant circuitry.

In yet another embodiment of this invention, the method for correcting the defective memory cell in the semiconductor memory device having multiple memory arrays is performed as follows: by means of the address of the defective memory cell, the first circuit is programmed; by means of the position of the memory array having the defective memory cell, the second circuit is programmed; upon receiving the address of the defective memory cell, the redundant memory cells in the memory array having the defective memory cell are selected. The redundant row memory cells are preferred. However, the defective memory cells may be defective column cells, such that the redundant row memory cells are replaced by redundant column memory cells.

As a portion of this invention, the 2-stage decoding circuit for the typical semiconductor memory device is disclosed. The redundant row decoder is a 2-stage decoder which has a first redundant decoder which can be programmed for holding the address of the defective row, and which receives the row address and generates the redundant row decoding signal and redundant row factor energization signal. The second redundant decoder receives the redundant row decoding signals and outputs the signal for selecting the memory array. In addition, the second redundant decoder energizes the selected redundant row of the memory cells of the memory array containing the defective row of the memory cells by adding a third section which is connected to the redundant row of the memory cells in response to the redundant row factor energization signal and array selection signal. The redundant column decoders can be programmed to hold the address of the defective column. They receive the column address and generate the redundant column decoding signal and redundant column factor energization signal. The second redundant column decoder can be programmed to hold the position of the array containing the defective column. It receives the redundant column decoding signal and can energize the selected redundant column of the memory cell containing the defective column of the memory cell by means of addition of a third section in response to the column factor energization signal and array selection signal. The decoder circuit can identify the memory portion, and can make effective use of the usable memory cells. In the following, the memory chip as an embodiment of this invention will be explained.

Figure 6:
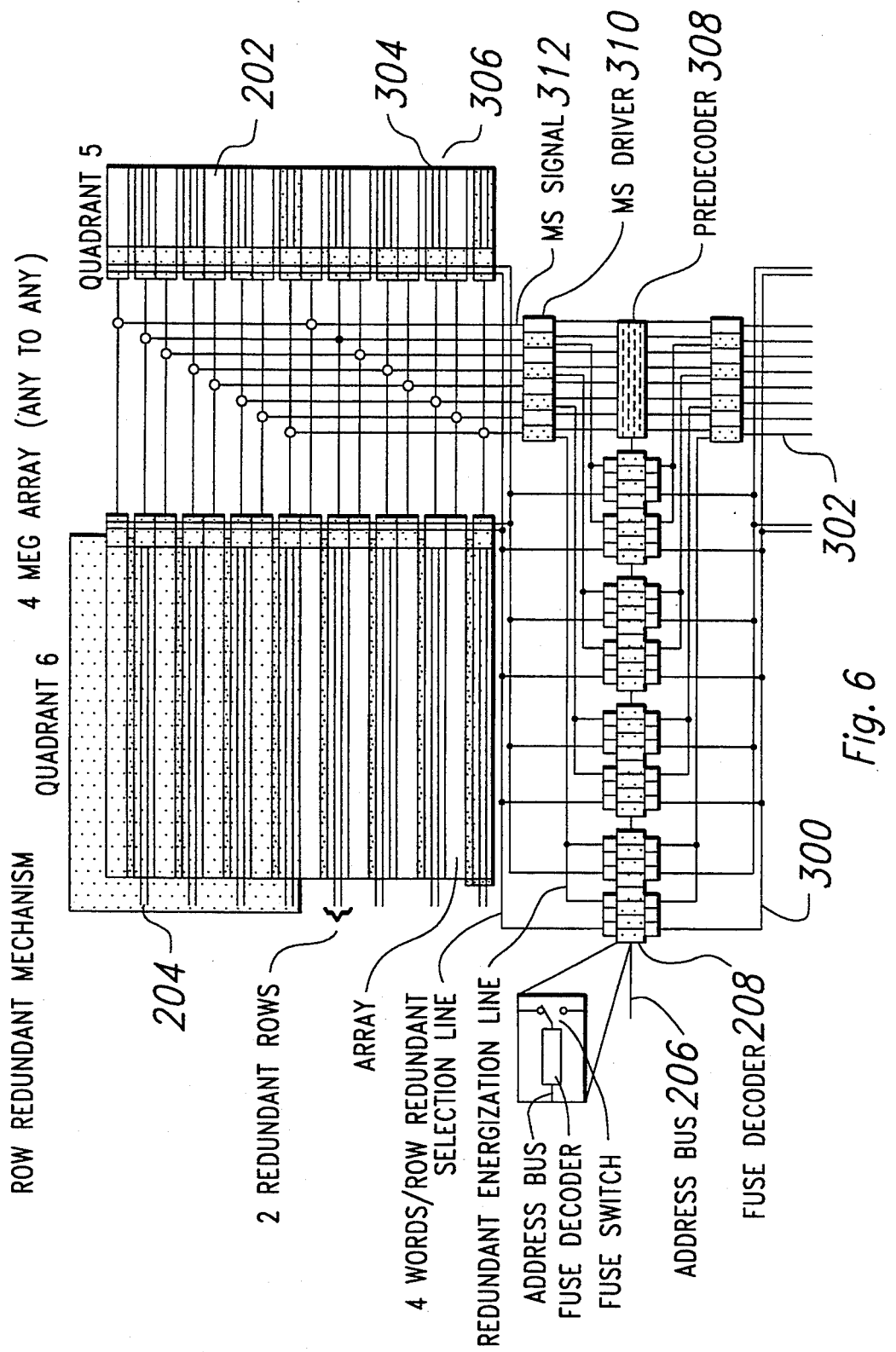
FIG. 6 shows the redundant mechanism of correction of the defective memory cells for 64 DRAM.

FIG. 6 shows the redundant mechanism for compensating for the defective memory cell row 202 of the 64M DRAM. This is carried out by replacing the defective memory cell row 202 with normally operating redundant memory cell row 204. Thirty-two fuse decoders 208 commonly connected to address bus 206 are positioned at the center of the chip. This does not cause an excessive detour of the address bus lines. That is, in the case when the ANY TO ANY redundant mechanism is used, when the redundant memory at memory quadrants farthest away from each other, such as the first quadrant and the fifth quadrant, are used as the redundant memory, the redundant energization line and the redundant selection line with the shortest distance are sufficient. Consequently, the chip area can be used effectively, and the shortest redundant energization line and the redundant selection line are sufficient; hence, the delay in the timing is also decreased, and the time for accessing the device can be shortened. On the other hand, in the case when fuse decoder 208 is set at the periphery instead of at the center of the chip, wiring becomes difficult for the commonly used redundant energization line, redundant selection line, and address bus, and there is inefficient utilization of the available area. For 512K bits memory block 304, there are four (only two are shown in the figure) redundant rows 306. These four row lines can be used simultaneously. For the 32 decoders for each redundant row, any programming method is allowed. There are 13-bit column addresses for each redundant row decoder. For the row redundant program, a plurality of fuses are used. For each single cycle of repair, up to 12 fuses can be burned. For the row redundancy, in order to perform the operation with a high yield, the ANY TO ANY program can be performed. When this ANY TO ANY redundant function is used, the 64 redundant rows present in one quadrant can be selectively allotted to all of the quadrants including the aforementioned quadrant. Consequently, the redundancy can be increased to about 6 times that of the fixed or flexible fuse decoder with the redundant memory set in the prescribed memory block. In addition, since programming is performed for predecoder 308 with respect to the memory quadrant, for MS signal 312 with respect to the memory block in each quadrant, and for fuse decoder 208 with respect to the row address of the memory, the number of fuses F0–F11 and the number of decoders 208 can be optimized. FIG. 6 shows the redundant function with respect to the row address. However, with the same configuration, it is also possible to program the redundant function with respect to the column address. In addition, with a quick determination as to whether the redundant row can be used, 2-stage decoding can be performed by means of 2-stage programmable predecoder 308 and fuse decoder 208. Table I lists the comparison for the row redundant function.

TABLE I

Figure 7:
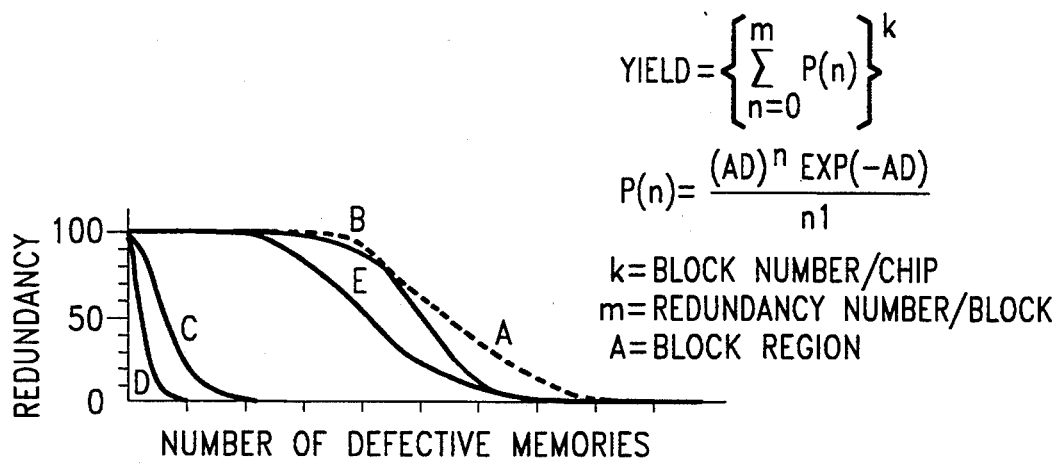
FIG. 7 shows the correlation diagram of defective memory number and redundancy by means of yield.

FIG. 7 shows the relationship between the number of defective memory cells in a prescribed area ( abscissa ) vs. redundancy (ordinate) for models A-E. The broken line represents model A of the 64M DRAM, while the solid lines show the other models B and E of the 64M DRAM. Although the area remains the same for the various memory cells, they nevertheless have different redundancies due to their different quadrants, word line, and bit line configurations. On the other hand, C and D show the redundancy configurations which may be used for the 16M DRAM, etc. All of the redundancies are calculated on the basis of the number of defects per unit area. Here, attention should be paid to the fact that the ANY TO ANY method tolerates about four times the number of defective memory cells as those in the conventional case in the stage with a yield of over 80% as an indication of the maturing period on the base of the learning curves of the semiconductor devices. That is, for the defective devices containing four times as many defective memory cells as the conventional method without redundant correction, by using the ANY TO ANY method, only 20% of the chips have to be disposed of, while the remaining chips can be assembled and shipped after passing the subsequent electrical tests.

Figure 8:
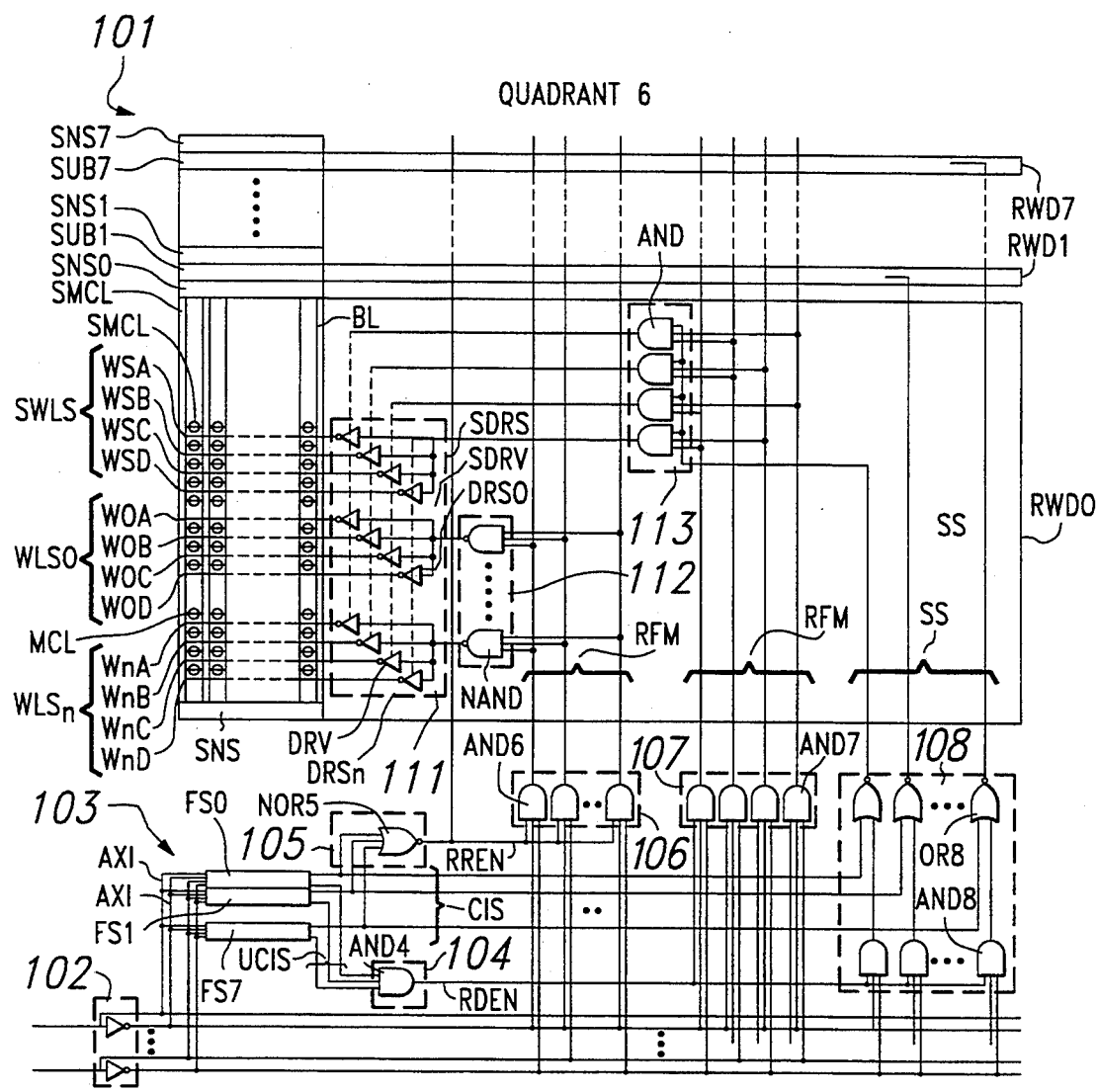
FIG. 8 is a circuit diagram illustrating the connection relationship between the fuse decoder and the memory block.

FIG. 8 shows the relationship between the quadrant 6 memory of the redundant mechanism in FIG. 6 and the adjacent redundant memory decoder circuit. Inverter 102 is connected to address bus 206 and generates the uncomplemented/complemented output signal. Fuse decoder circuit 208 shown in FIG. 6 is connected to the uncomplemented/complemented output signal, and determines the yes/no of the coincidence between the address bus signal and the redundant memory address. FS0–FS7 of fuse decoder 103 can program the memory address in quadrant 6 shown here or the memory address in the other memory quadrant. Standard memory row group DRS0-DRSn consists of 4 row lines each. Predecoder 308 shown in FIG. 6 can be made of "AND" logic circuits 106, 107, and 108. These "AND" logic circuits receive the uncomplemented/complemented output signal of inverter 102 and select the prescribed memory row group. That is, logic circuit 106 selects one out of the memory row groups WLS0-WSLn consisting of four row lines. Logic signal 107 activates one line corresponding to the total row group in each memory block. Logic circuit 108 can select one memory block from the multiple memory blocks. On the other hand, for selection of the redundant memory row group SDRS, the output signals of fuse decoders FS0-FS7 are received by "NOR5" logic 105, which gives an output signal RREN. When the output signal RREN is low, redundant row group SDRS is activated, logic circuit 106 is made invalid, and the conventional memory row is made inactive. On the other hand, when output signal RREN is high, instead of redundant row group SDRS, one of the conventional memory row groups WLS0-WLSn is activated, while the redundant memory group is made invalid. Here, logic circuit 107 decodes a portion of the bit signal of the output signal of inverter 102, activates the inverter related to A-D in the prescribed memory block (the configuration using the "NAND" gate with the output of logic circuit 113 as the steering clock is also allowed), and selects the prescribed row. Consequently, fuse decoders FS0–FS7 activate the redundant memory group locate in the same quadrant, and can program to ensure selection of the prescribed row line by means of the lower address bit. However, when defective A-row line of the conventional memory block is replaced by A-row line in the redundant row group, the same redundant row group can not replace further the other defective A-row line. In this case, it is only required to use A-row line of the other redundant memory row group related to RREN signal line. Since all of the memory row lines contain four row lines from A to D, programming for the storage of the defective memory row line and for preventing inclusion of the same type of row lines in the same redundant row group is effective in increasing the redundancy. In addition, the redundant address coincidence signal RREN is preferred for the defects caused by short-circuiting of the row lines, since it can switch the conventional memory cell group to the redundant memory cell group at an early stage. Consequently, it is also possible to form the redundant mechanism by replacing one group of the redundant row lines simultaneously by setting redundant row group not connected to logic circuit 107 for repairing the defect caused by the short-circuiting of the rows.

Figure 9:
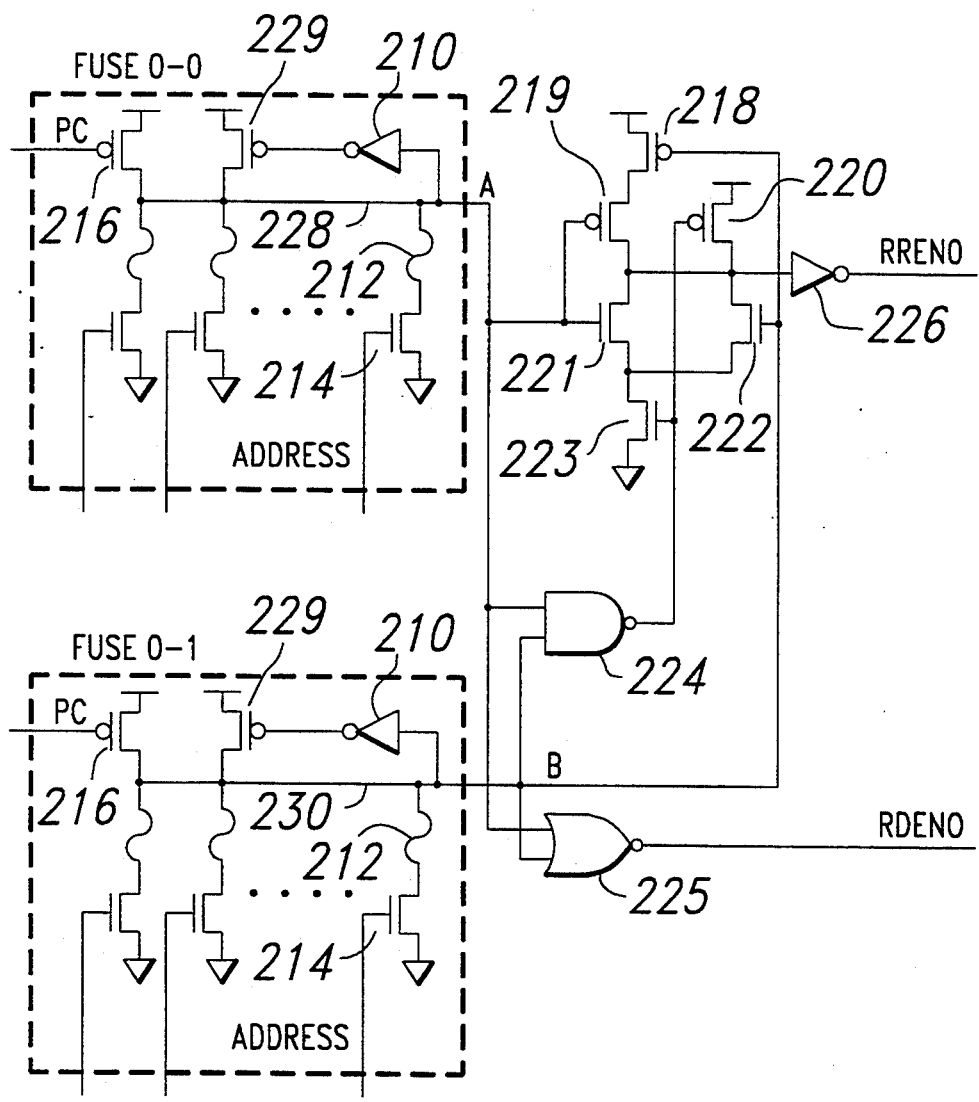
FIG. 9 shows the address coincidence detecting circuit having multiple fuse decoders.

In order to start the redundant mechanism shown in FIG. 8, the fuse decoders shown in FIG. 9 are used for the redundant mechanism start method. With this method, upon receiving the external address, inverter 102 provides the uncomplemented/complemented signals of each address bit and burns fuse 212 of FUSE-0—0. In this way, the programmed redundant address is detected and address coincidence signal A is output. On the other hand, the other fuse decoder FUSE0-1 in the same redundant address decoder FS0 receives the aforementioned external address, determines that it is not the programmed redundant address, and outputs an address noncoincidence signal B, that is, a low logic level signal. By outputting logic signal RREN0 as the result of the exclusive OR operation for these address coincidence signal A and noncoincidence signal B, redundant row group SWLS is energized, while defective row group WS0 is made invalid. Furthermore, in response to the aforementioned external address, one row line, e.g., WSA, selected among the aforementioned redundant row group SWLS is energized, while the other row lines WSB, WSC, WSD are made invalid, so that the redundant mechanism can be started. This can function particularly effectively for the defective bit. Since one redundant address decoder FS0 can select A, B, C, D in redundant row group SWLS, one time for each, the defective row line can be replaced efficiently without an excess of redundant rows. However, for the multiple fuse decoders within one redundant address decoder, it is impossible to perform programming for the addresses related to the same row line. For example, when the address for selecting the A-row line is programmed to two or more fuse decoders within the same redundant address decoder, the redundant start signal cannot be output correctly.

FIG. 9 shows the configuration of fuse decoder FS0. For each of fuse decoders FS0 or FS7, it is possible to replace the conventional memory row lines with the redundant row lines with respect to the multiple address signals. For example, fuse decoder FS0 may have multiple fuse decoders. For fuse decoder FS0 connected commonly to inverter 102, there are the following three states: the state in which fuse 0—0 recognizes the contents of the programmed address and the address bus and generates the coincidence signal, the state in which fuse 0-1 recognizes the contents of the programmed address and the address bus and generates the coincidence signal, and the state in which two fuses recognize the contents of the address bus are not in agreement with. Consequently, when different addresses are programmed, both fuses, cannot generate the coincidence signal together. For fuse decoder 0—0, as redundant mechanism start signal PC is activated and transistor 216 is turned ON, common node 228 is precharged. When transistor 214 conducts in response to the address signal, fuse 212 connected to said transistor 214 is blown and programmed; the potential at common connection node 228 is not discharged, and it remains high by means of a pull-up transistor 229 through inverter 210.

On the other hand, in the case when programming is not performed and fuse blowing does not take place, common connection node 228 is discharged, and a low-level signal is output to point A. Fuse decoder 0-1 also can be programmed in the same operation as above. The address coincidence signal generating circuit consists of transistors 218, 219, 220, 221, 222, and 223, as well as inverter 226. The address un-coincidence signal generating circuit is made of "NAND" logic gate 225. Consequently, the coincidence signal selects one redundant address row group, and makes a conventional row group invalid. On the other hand, the uncoincidence signal is a signal that controls the switching in which the redundant address row group is made invalid while a conventional row group is made active. For address coincidence signal RREN0, after application of redundant mechanism start signal PC, if un-coincidence is recognized between the two fuse decoders 0—0 and 0-1 in response to the address signal (both points A and B are at the low level), logic transition takes place from the high level to the low level; if a coincidence signal is generated by any one of these fuse decoders, there is no change in the logic state. Consequently, the coincidence signal of the parallel connected FS0-FS7 can be determined more quickly than in the conventional case, and the switching operation between the conventional memory and the redundant memory can be performed at an earlier stage. The fuse decoder group shown here consists of two fuse decoders. However, it is also possible to use more programmable fuse decoders. The time programmed for blowing the fuses is independent of the number of fuses to be blown, except for the spotwise scanning time of the laser beam on the fuses. Consequently, there is no disadvantage in arranging multiple fuse decoders in the address coincidence signal generating circuit. In addition, by using the circuit shown in FIG. 9, the area of each fuse decoder can be reduced, and the address coincidence signal is determined in a state related to the other fuse decoders. Consequently, timing is fast, and the access performance to the overall device can be improved.

The purpose of the row redundant circuit is to replace the defective word line with the other standard word line for repair so as to ensure normal operation of the overall chip. In each quadrant of the 64M memory, there are 16 blocks of 512K bits array. Each of these blocks has four physically redundant word lines. The four redundant rows are all set at the most remote position from the sense amplifier of the 512K array, and each redundant word line can be used for replacing any defective row in the same block or defective row in another memory block or even another memory quadrant. Attention should be paid to the fact that there is no dummy word line that can limit the type of the row that can be replaced by the redundant row, that is, the row that can be replaced by BL or BL row. As far as the programming of the redundancy is concerned, each quadrant is divided into two octant spaces of 8 blocks. With respect to any redundant row programmed in an octant space, it is possible to program a similar redundancy to the image block of the other octant space. A feature of this circuit is that in the two octant spaces, for the DFT x32 parallel and copy and other special operation modes for the operation of the array blocks, it is necessary to have a complicated decoding circuit for identifying the octant space having the redundant row and the octant space having no redundant row. In order to avoid this problem, the two octant spaces are symmetrically programmed, and the excess decoding circuit and fuse can be omitted. In addition, in order to increase the access speed, the RA11 address line is not decoded, and the access time of the redundant row corresponds to a high speed as compared with the decoding time of RA11 address line. The device has 64 redundant decoders RRDEC. Within the chip, a total of 512 logic word lines can be replaced. Each logic redundant line is made up of a pair of two physical rows in each memory block. However, since there are only four physical redundant rows in each 512K memory block, the maximum number of rows that can be replaced within the 512K memory block is only four. On the other hand, for the ANY TO ANY method, there is no such limitation, and the redundant row of the quadrant containing the redundant row can be used for replacing the defective row in the other quadrant. For the overall device, a total of 512 word lines can be replaced, and there is no limitation on their positions. For example, upon receiving the output of inverter group 102 connected to address bus 206, the fuse decoder can replace the memory present in all quadrants, and the defective row line can be cut off from the effective signal line so that the contents of the defective memory do not appear on the bit line; hence, as long as there exists unused redundant memory, repair can be performed for all quadrants.

Figure 10:
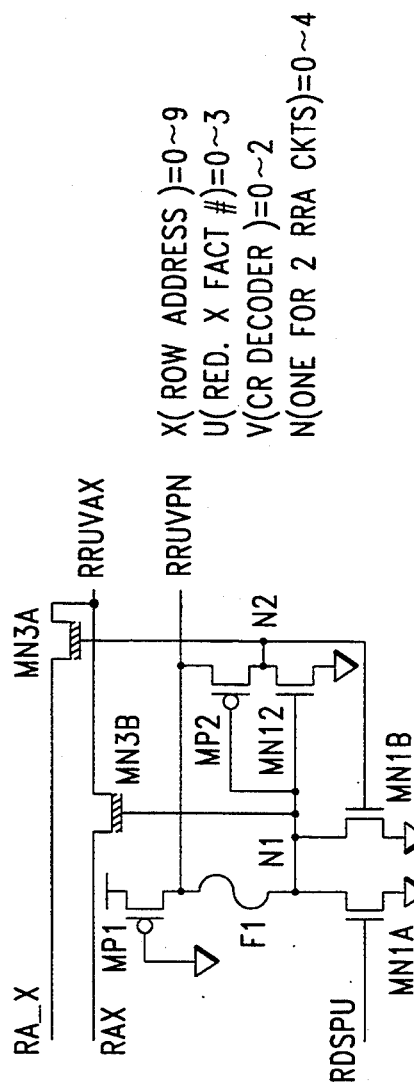
FIG. 10 is a circuit diagram of RRA (ROW REDUNDANT ADDRESS) generator.

FIG. 10 shows the RRA (ROW redundant address circuit). It is used for generating the redundant address of the redundant decoder corresponding to the fuse decoder of the redundant mechanism shown in FIG. 9. In the device, there are 120 RRA circuits, which are divided into 12 groups, each of which has 10 RRA circuits. Row addresses RA0/RA0 through RA9/RA9 are used as the inputs to these groups. Each group represents the logic redundant row address. With respect to the programming of redundancy, when the address line is to take logic "1," fuse F1 is blown, so that the redundant row address is programmed. On the other hand, when the redundant row is not used, F1 is not blown and is left unchanged. During the operating cycle, the fuse is programmed; in this way, only when the input address during the operation cycle is in agreement with the redundant address, RRA output, namely RRUVAX is set as logic "0." When the input address is not in agreement with the redundant address, RRUVAX gives an output of logic "1." Consequently, the redundant circuit is programmed as A72H row as the RRDSPU input pulse signal is set at the high level and the pulse latches the redundant address when the power source is turned on. In this case, for the programming, the 10 RRA circuits as a group make use of addresses RA0/RA0 through RA9/RA9. Attention should be paid to the fact that addresses RA11 and RA10 are not used here. Since there is no need to select the octant space in each quadrant, RA11 can be ignored. Consequently, the chip can be used effectively. RA10 is decoded in the RRDEC circuit. Finally, there is node RRUVPN. This node acts as the power source line of the inverter having MP2 and MN2. It can prevent an excessive drop in the voltage of N1 when the power source is turned ON in the case when the fuse is not blown. Since this signal is generated, it is difficult for MP1 to pull up node N1 as the limiter. Due to limitation imposed by the layout, the two RRA circuits share a transistor MP1 with a size of (W/2=20/0.8 μm), and the size of MP2 in the circuit is (W/1=10/0.8 μm). In this way, RRUVPN is merely a common node between two RRA circuits.

Figure 11:
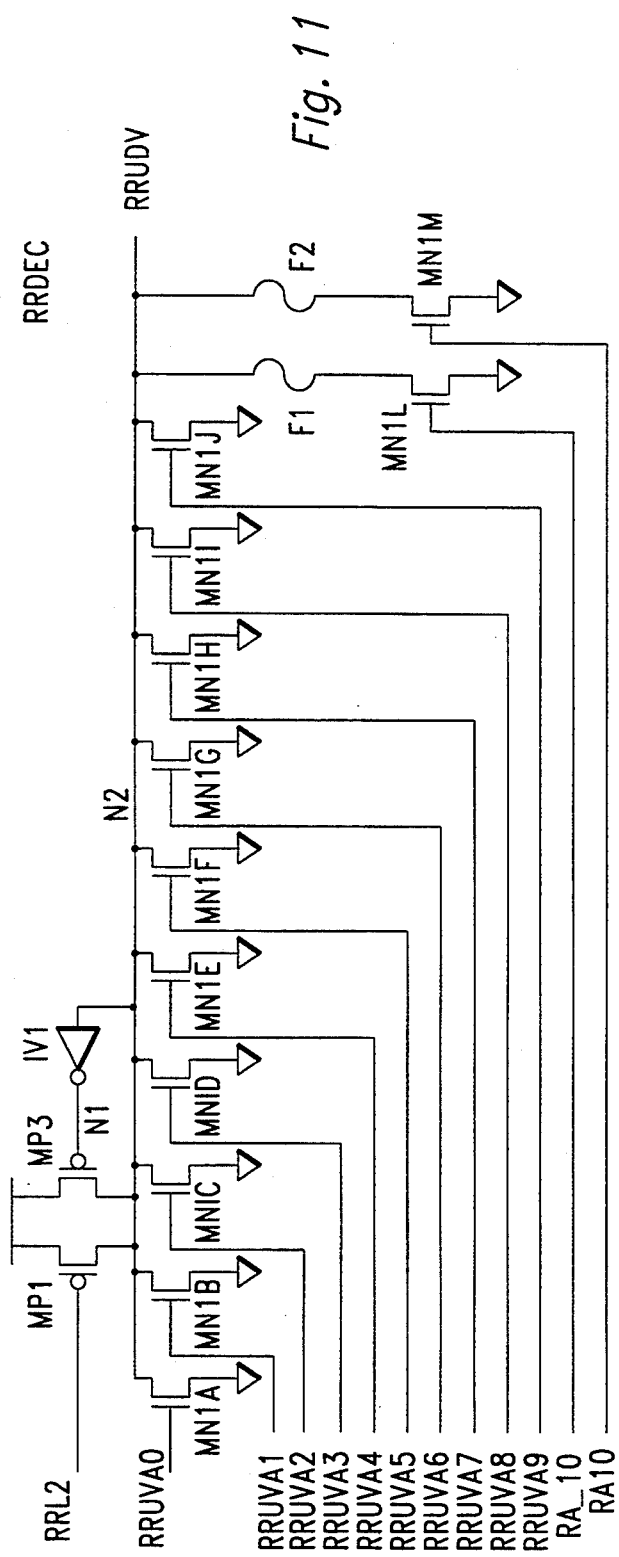
FIG. 11 is a circuit diagram of REDEC (ROW REDUNDANCY DECODER).

FIG. 11 shows RRDEC (ROW redundant decoder). This circuit is used for decoding the redundant address generated by the RRA circuit and composes the redundant mechanism corresponding to the entire redundant mechanism shown in FIG. 9 in company with RRA circuits. The outputs of 10 RRA as a group form the inputs of the decoder with a "NOR" configuration. The outputs of 10 RRA are generated from row addresses RA0/RA0 through RA9/RA9. In addition, RA10 and RA10 are also connected as "NOR" inputs through two fuses. The fuses act as switches for energization of the circuit. At least one of them must be blown to excite the circuit. In the case when the programmed redundant RA10 is set at logic "1," the fuse connected to input RA10 is blown. In the case of programming to logic "0," the other fuse is blown. In the case when neither fuse is blown, RRDEC remain invalid in any operation cycle. When both fuses are blown, the device ignores R10/R10, and the two rows in the octant space can be selected at the same time. During the precharge, RRL2 switches transistor MP1 "ON," and the output is precharged to a high level. It is possible to set all of the input rows to invalid logic and high current flow can be prevented. In the operating cycle, if address RA0/-RA10 are in agreement with the programmed redundant address, then the output remains at the high level, and it is able to indicate detection of a redundant row. It differs from the typical redundant decoder circuit which uses a single-stage "NOR" decoder in that a 2-stage decoding system is used. RRA is the predecoder, and RRDEC is used in the final decoding operation. While in the conventional method, fuses are needed to correspond to the addresses of the uncomplemented and complement addresses entering the decoder, this circuit can reduce the number of fuses required on the chip. Also, it is possible to reduce the capacitance of decoding node N2 so as to increase the speed corresponding to the decoding time. At the time when the mass production efficiency of the device is to be increased, these circuits can be used to replace the redundant mechanism shown in FIG. 9 so as to reduce the chip area needed for the redundant mechanism. However, the critical point is that the maximum number of defective memory cells should be smaller than at the initial stage of production. That is, the redundant mechanism shown in FIG. 9 has a high redundancy for repairing the defective bits. On the other hand, for the redundant mechanism shown in FIGS. 10 and 11, although the redundancy is reduced, the chip area can be reduced. This is an advantage.

Figure 12:
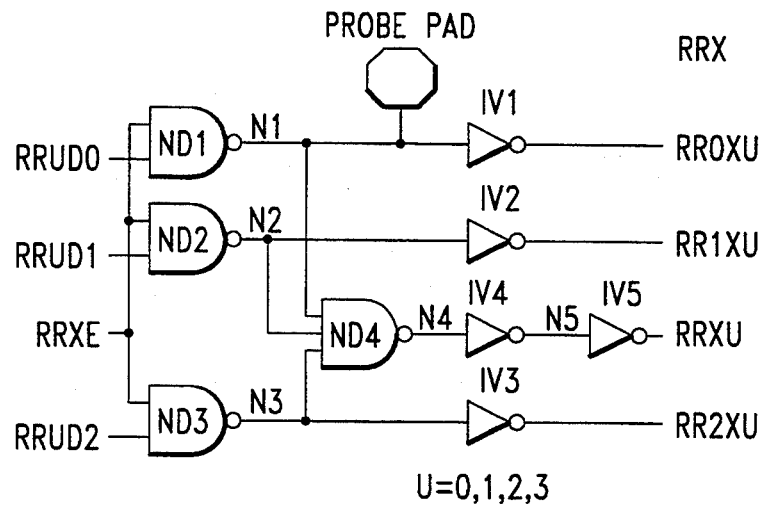
FIG. 12 is a circuit diagram of RRX (ROW REDUNDANCY X FACTOR).

FIG. 12 shows the RRX (ROW redundant X factor) circuit. There are eight such circuits in DRAM. Each of them can make parallel selection of one of the four redundant rows in 512K block by means of inputting three signals of the 12 RRDEC outputs to gates ND1, ND2, ND3 simultaneously. The output signal can be sent to RRQS, ROW redundant quadrant selection circuit. Three "AND" gates can be energized by means of the RRXE signal. In this case, it is important to ensure that energization of the RRXE signal is started only in the case when the redundant decoding is ended, that is, after the nonselection RRUDV signal goes low. If the RRXE signal arrives too soon, in the interval between the rising edge of RRXE and the falling edge of the nonselection RRUVD signal, a high pulse is generated in output PROXU, RR1XU, or RR2XU. Due to the high pulse of these output, the RRQSQ signal is released, and it is unable to determine correctly which quadrant makes use of the redundancy. Another important feature of the RRXE gate timing is that it is necessary to switch off the gating as soon as possible after the operation cycle. This is for avoiding the high current in precharge with "NOR" gate RRQS decoder made invalid.

Figure 13:
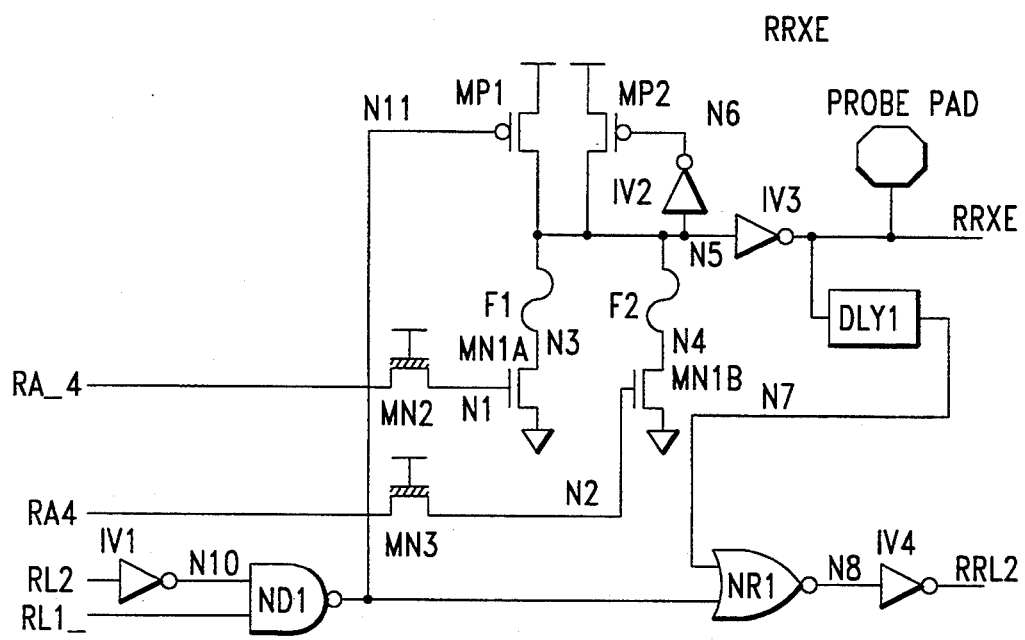
FIG. 13 is a circuit diagram of RRXE (ROW REDUNDANCY X FACTOR EVALUATION).

FIG. 13 shows the RRXE (ROW redundant X factor evaluation) circuit. This RRXE circuit is designed to hamper the operation of the row redundant decoder in realizing the correct timing as in the aforementioned RRX circuit. In this way, gating of the RRX circuit can be realized by an appropriate RRXE signal sequence. In the RRXE circuit, RA4 and RA4 are used for evaluating the address of the redundancy inside RRDEC. This is used for precharge of the circuit. P-channel transistor MP1 is much larger than the circuit of RRDEC circuit. It delays switch-off and delays the start of RRXE, and provides a delay by means of inverter IV2. Since it is a large transistor, high speed pull-up is performed at node N2, and input of RRQS "NOR" gate is made invalid; hence, high current flow can be prevented. It is possible to generate agreement with the bus gate within RRA by using two bus gates MN2 and MN3. Since RL1 and RL2 signals are gated at the same time and a precharge signal is sent to the gate of MP1, it is possible to realize the early switching of precharge by means of the falling edge of RL1 and the delayed turn-on of precharge by means of the falling edge of RL2. Finally, gated signals of RL1 and RL2 are gated by the delayed RRXE signal, and can generate precharge signal RRL2 of redundant circuit. In this way, before the other row redundant circuit performs precharge, interlock is performed for making the RRXE circuit to the precharge cycle. Consequently, in the precharge of the RRXE circuit, before start of precharge of these decoders by means of activation of RRL2, the various decoder inputs can be made invalid. As a result, it is a decoder having an active input, and there is no contradiction between the decoder input and the precharge cycle. If such a contradiction does take place, a high current is extracted from within the decoder. In this case, since the two fuses are blown, it is possible to make the row redundant circuit invalid with respect to the overall device. Attention should be paid to this feature.

Figure 14:
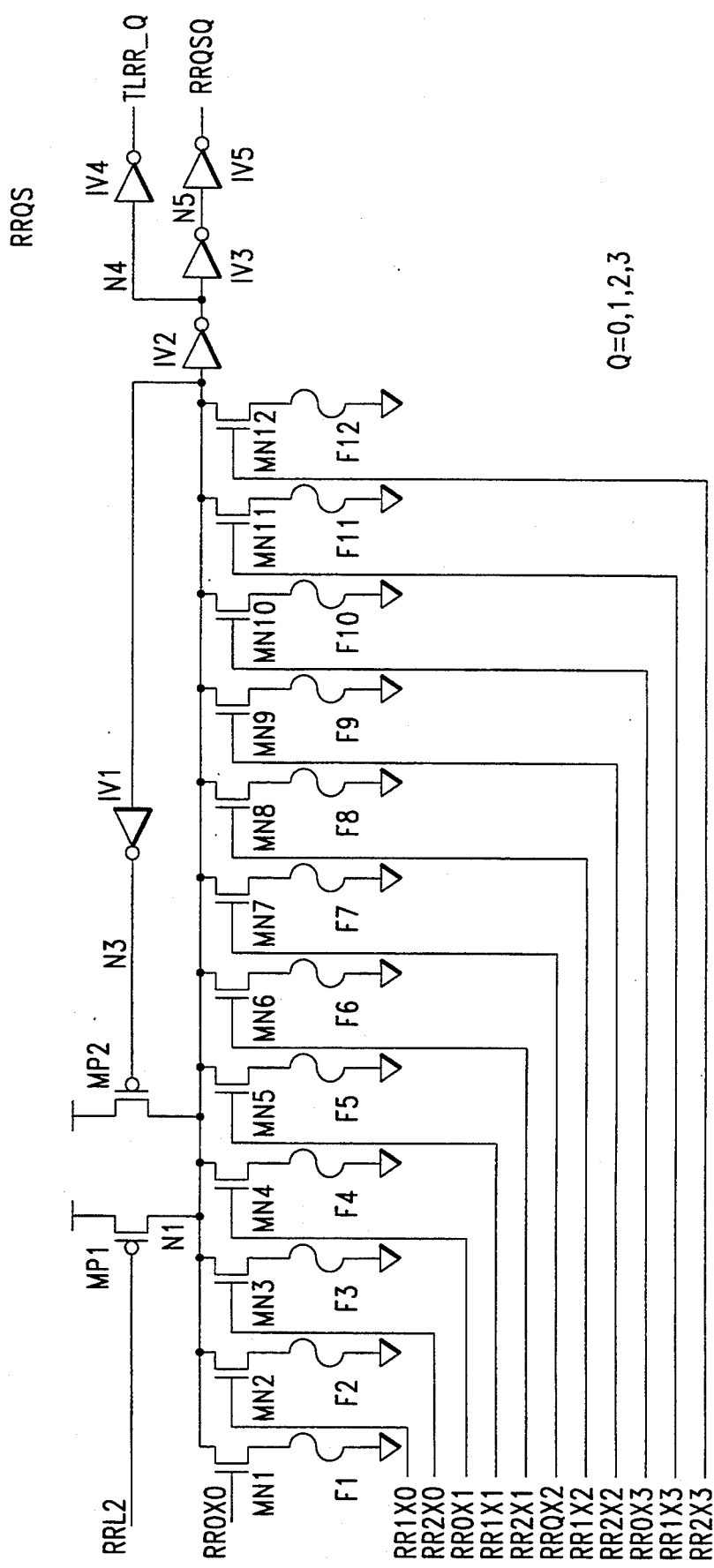
FIG. 14 is a circuit diagram of RRQS (ROW REDUNDANT QUADRANT SELECTION).

FIG. 14 shows a RRQS (ROW redundant quadrant selection) circuit. While the aforementioned circuits can identify by means of decoding the row address used for the redundancy, this circuit can identify the quadrant to which the redundant row belongs by means of performing further decoding. The device has four such RRQS circuits, each of which can select the quadrant of the array. The RRQS circuit is designed as a "NOR" gate with 12 inputs. When this circuit is designed, if the redundant address does not belong to the repaired quadrant, the fuses corresponding to RRQS are blown. When the quadrant corresponds to the repaired row, the fuses are not blown. In this way, when the redundant row belongs to the quadrant, node N2 is always at the low level, and activated output RRQS signals, that is, TLRQ and RRQSQ, are generated. In the case when the redundant row does not belong to the quadrant, or when what addressed is not a redundant row, node N2 remains at the high level. RRL2 signal is used for turning on MP1 during precharge and charging N2 to the high level. In the case when it is not selected, MP2 with an inverter is used for keeping the precharge level at node N2. Attention should be paid to the fact that by means of appropriate design, the redundant address can select any number of activated quadrants. This is realized by not blowing the fuse corresponding to the selected address in the RRQS circuit related to the quadrant having the repaired row. The fuses of RRQS circuit are able to ensure that when they are blown, the potential at node N1 is not discharged even when the predecoded address bit signal is applied to the gate of the transistor; on the other hand, when the fuses are not blown, since node N1 is discharged, the transistor makes the output of inverter IV2 high. In fuse decoder circuit RRQS shown here, although transistor MP2 which pulls up common node N1 can be a small transistor as needed for maintaining the potential of node N1, as long as precharging cannot be performed again by the RRL2 signal, once the potential at common node N1 drops, the next cycle of redundant address decoding cannot be performed. Attention should be paid to this feature.

Figure 15:
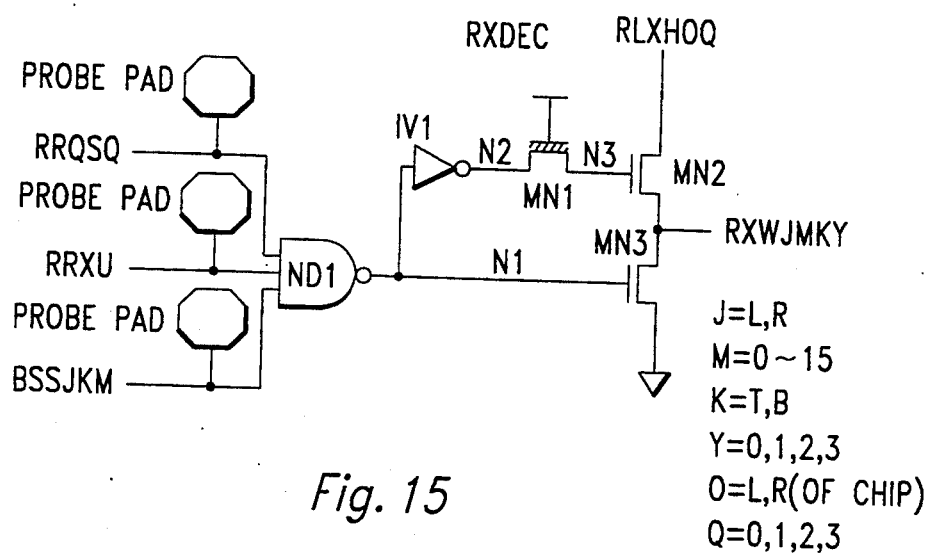
FIG. 15 is a circuit diagram of RXDEC (REDUNDANT X WORD DECODER).

FIG. 15 shows the RXDEC (redundant X word decoder) circuit. For the RXDEC circuit used as the last decoding of the redundant row, the voltage level boosted from the word line driver to the redundant row is transmitted. The various physical redundant rows are generated by the RXDEC circuit. The redundancy decoding is performed by means of the 3-input "NAND" gate. From the given redundant address, RRQSQ identifies the quadrant, and RRXU decodes one of the four redundant rows in each 256K array block. Finally, the standard row decoding is performed, block signal BSSJKM selects one of the 16 array blocks, and the row redundancy decoding is ended.

Figures 16, 17:
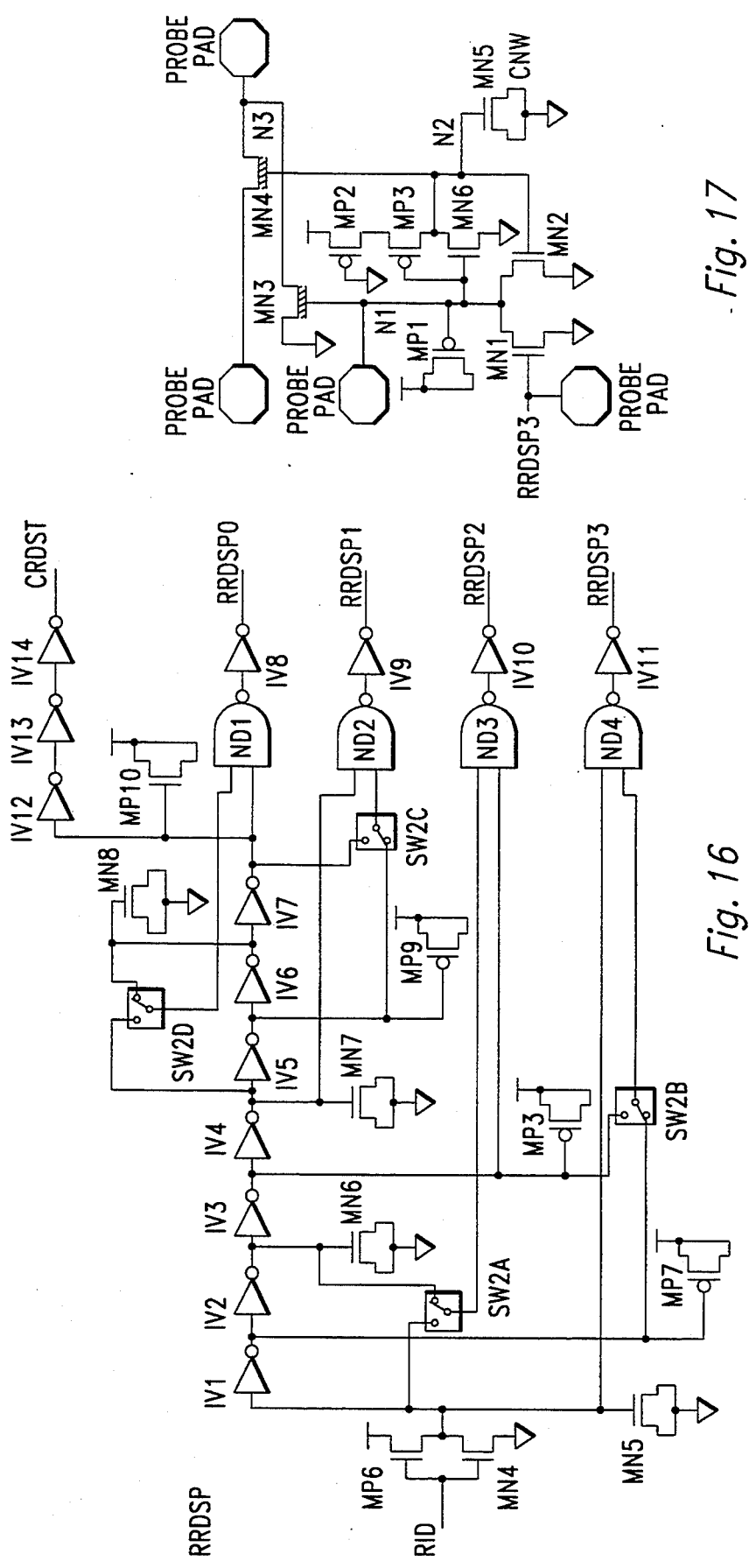
FIG. 16 is a circuit diagram of RRDSP (ROW REDUNDANT DECODER SET SIGNAL).
FIG. 17 is a circuit diagram of RRATST.

FIG. 16 shows the RRDSP (ROW redundancy decoder set signal) circuit. The purpose of this circuit is to generate pulses in the RRA and CRRA circuits and to generate the redundant address at the time when power source is turned on. AS a sequence of connected inverters and capacitors, the input/output stages of these inverters are gated by means of the "NAND" gate to provide pulses and give the pulse. By using RID as the input, the circuit is excited when the power source is turned on. In this case, instead of generation of one pulse for all of the RRA circuits, four pulses are generated at different times by means of 120 RRA circuit. Consequently, it is possible to avoid the simultaneous excitation of all of the RRA circuits, which is a reason for the high peak current, and the problems of noise, etc. can be avoided. In addition, by changing the metal mask of SW2A, SW2B, SW2C, SW2D, the pulse widths of RRDSP0, which has RRDSP1, and RRDSP2, which has RRDSP3, are combined to generate two groups of pulses instead of four groups of pulses. After pulses are generated, the output CRDST is excited. In this way, the pulse output is started for performing the column redundant address latch in the CRDSP circuit.

FIG. 17 shows the RRATST circuit. The purpose of this circuit is to check whether the pulses generated by RRDSP are sufficient in latching the RRA address. It makes use of only the internal probing. RRATST is identical to RRA except that the fuse used in RRA is replaced in this case by capacitor MP1. Instead of using a standard input, the probe pad for the external signal is set on RAX, and RRX input is grounded. Another probe pad is connected in parallel to the RRDSPU signal. In this way, it is possible to latch the alternative signals. Capacitor MN5 sets node N2 to the low level at the time when the power source is turned on. This circuit is able to check whether the RRDSPU pulse width is sufficient for discharging node N1 of capacitor MP1. The state can be monitored by the probe pad at nodes N1 and N3. For the sense clock which performs the operation chain of the sensing sequence of the data in the device, excitation takes place each time when the address decoding performed within the cycle of any operation is ended. This is accompanied with generation of various clocks to ensure the ON state of the selected sense amplifiers. Before entering each sense clock circuit, a survey is performed for the sense amplifier circuit of the 64M memory. First, the quadrant is divided into 16 blocks of 512K memory arrays. Eight bank-structured sense amplifiers are set in one quadrant. These sense amplifiers are set in parallel to the central bonding pad line and are located side by side from the central side to the chip side. In order to reduce the used area of the chip to a minimum, the 64M DRAM is designed with the common sense amplifier. In the common sense amplifier circuit, each sense amplifier bank is shared by two 512 Kb memory array blocks. That is, it is possible to sense 1M bits. Consequently, no sense amplifier bank is present at the two ends of each quadrant. Attention should be paid to this feature. Each sense amplifier bank has 256 sense amplifiers. Consequently, each bank takes care of the 256 columns of the memory arrays on its two sides. A prominent feature of this circuit is that the two columns taken care of by the same sense amplifier do not have the same Y address, that is, one of them has an odd number address, while the other has an even number address. Consequently, its switching can be performed by selecting the YS line which traverses vertically through the sense amplifier.

Just as in the case of the row redundancy, the configuration of the column redundancy has the purpose to form a chip that can replace the defective column so as to ensure perfect operation. In the chip, the memory array is divided into 8 quadrants. Each quadrant has 16 array blocks with 256 columns. Each array block has 6 redundant columns. These redundant columns can be set on the two sides facing the center of the chip. The redundant column is made of a pair of bit lines BL and BL and a sense amplifier. Different from the row redundant circuit in which the redundant row can be used to replace any defective row, the column redundancy repair is performed under control of the data passage of the defective column. Each array block is supported by two sense amplifier banks. Each of these banks has two local I/O data passages with respect to two different main I/O lines. Consequently, the redundant column with the same main I/O line with respect to repair is used.

The redundant column array has the same form as the block array. The redundant sense amplifier bank is an extension of the conventional sense amplifier bank. Each of these banks has 6 redundant sense amplifiers. In addition, the initial three sense amplifiers are connected to the even-numbered main I/O, while the other three sense amplifiers are connected to the odd-numbered main I/O. With respect to repair by redundancy, it is necessary to first find out which sense amplifier is connected to the defective column. As soon as the defective column and the sense amplifier having the defective portion are identified, they are replaced by the redundant column which has the same main I/O as the sense amplifier.

In redundant programming, it is necessary to replace the two columns adjacent to each defective column in the array block. The two columns have the common column address CA11-CA1. At the same time, the other column with the same address in the next octant space is replaced. The reason for performing repair for two octant spaces at the same time is the same as that in the case of the row redundant circuit. In addition to repair of two columns at the same time, as an option, it is possible to replace the adjacent four columns of columns CA11-CA2 having the same redundant decoder. Also, there is the so-called ANY TO ANY option in which several quadrants perform the replacement operation by using the same redundant decoder.

There is the following limitation on the replacement of several columns. The 64 redundant decoders allows only replacement of 64 logic columns; although there are 6 physical redundant columns in each array block, each repair uses at least two columns; hence, each array block allows only three redundancies. In addition, each bank has six redundant sense amplifiers, among which three are connected to the even-numbered main I/O, while the other three are connected to the odd-numbered main I/O. In this way, the number of replacement by the same main I/O is limited to 3. In addition, for repair of the columns with the same address from different blocks, in the case when the same RA8-RA9 address is not shared, it is necessary to add the redundant decoders independently.

In the above, this invention has been explained in detail with reference to embodiments. However, these embodiments are only presented as examples, they do not have any defining function. In addition, the details may be amended at many points by the experts in the field with reference to the above explanation. For example, in the above, this invention was explained with reference to the DRAM. However, the method of this invention may also be used as the redundant configuration for other types of memory containing read-only memory (ROM) and static random access memory (SRAM). In the aforementioned examples, one group has four row lines or column lines. However, eight rows or eight columns may also be used as well in order to increase redundancy. In addition, the n-channel transistors can be replaced by the p-channel transistors, and the field-effect transistors may be replaced by bipolar transistors. The field-effect transistors referred to here may be the MOS transistors. Their configurations can be formed on an IC by using conventional semiconductor manufacturing technology. All of these changes and other changes are contained in the technical ideas of the claims of this invention.

The effects of the invention can be summarized briefly as follows.

(1) Many electrical circuits can be formed in the semiconductor IC chip.

(2) The defective memory cells, especially bit defects, generated in the semiconductor IC manufactured using submicron technology can be replaced by the redundant memory cells programmable by the blowing of fuses.

(3) It can provide a memory cell redundant mechanism which can be used to repair the defective memory cells and defective row lines due to short-circuiting in all of the memory quadrants free of errors at high speed.

(4) It can provide a type of semiconductor IC with improved manufacturing yield.

We claim:

1. A semiconductor memory device comprising:

a plurality of arrays of memory cells;
each of said arrays of memory cells being arranged in a matrix of rows and columns of individual memory cells;
groups of redundant rows of redundant memory cells corresponding to at least some of said arrays of memory cells;
address generating means for providing an address signal to selectively drive one of the row and column of memory cells included in an array of memory cells;
first programmable redundant decoder means for containing the row address of a defective row of memory cells having at least one defective memory cell and being in one of the plurality of arrays of memory cells;
said first redundant decoder means being responsive to the receipt of a row address corresponding to the row address of a defective row of memory cells for generating a redundant row decoder signal and a redundant row factor signal;
second programmable redundant decoder means for containing the position of the array of memory cells which contains the defective row of memory cells having at least one defective memory cell;
said second redundant decoder means being responsive to the redundant row decoder signal from said first redundant decoder means for generating an array selection signal; and
redundant energization circuit means connected to said groups of redundant rows of redundant memory cells and responsive to the redundant row factor signal of said first redundant decoder means and to the array selection signal of said second redundant decoder means for generating a signal energizing a selected redundant row of memory cells from said groups of redundant rows of redundant memory cells as a replacement for the defective row of memory cells in the selected array of memory cells.

2. A semiconductor memory device as set forth in claim 1, wherein each of said first and second programmable redundant decoder means includes respective fuse sets defined by a plurality of fuses; and
means responsive to the receipt of a row address associated with a defective row of memory cells in one of the plurality of arrays of memory cells for blowing one or more selected fuses in programming said first and second programmable redundant decoder means in a manner identifying any defective rows of memory cells included in the semiconductor memoir device and the respective arrays in which a defective row of memory cells occurs .

3. A semiconductor memory device comprising:
a plurality of arrays of memory cells;
each of said arrays of memory cells being arranged in a matrix of rows and columns of individual memory cells;
groups of redundant rows of redundant memory cells corresponding to at least some of said arrays of memory cells;
address generating means for providing an address signal to selectively drive one of the row and column of memory cells included in an array of memory cells;
redundant address coincidence circuit means, said redundant address coincidence circuit means including:
a first programmable fuse decoder for receiving an external address signal indicative of a memory cell,
a second programmable fuse decoder for receiving the same external address signal indicative of a memory cell as received by said first programmable fuse decoder,
said first programmable fuse decoder being responsive to a first address of a defective memory cell,
said second programmable fuse decoder being responsive to a second address of a defective memory cell different from said first address to which said first programmable fuse decoder is responsive,
said first programmable fuse decoder generating a first address coincidence signal when the external address signal received thereby coincides with said first address of a defective memory cell,
said second programmable fuse decoder generating a second address coincidence signal when the external address signal received thereby coincides with said second address of a defective memory cell, and
a logic circuit connected to the outputs of said first and second programmable fuse decoders and responsive to the generation of either the first address coincidence signal from said first programmable fuse decoder or the second address coincidence signal from said second programmable fuse decoder for providing a redundant enable signal; and
redundant energization circuit means connected to said groups of redundant rows of redundant memory cells and responsive to said redundant enable signal for generating a signal energizing a selected redundant row of memory cells from said groups of redundant rows of redundant memory cells as a replacement for the defective row of memory cells in a selected array of memory cells.

4. A semiconductor memory device comprising:
a plurality of arrays of memory cells;
each of said arrays of memory cells being arranged in a matrix of rows and columns of individual memory cells;
groups of redundant columns of redundant memory cells corresponding to at least some of said arrays of memory cells;
address generating means for providing an address signal to selectively drive a column of memory cells included in an array of memory cells;
first programmable redundant decoder means for containing the column address of a defective column of memory cells having at least one defective memory cell and being in one of the plurality of arrays of memory cells;
said first redundant decoder means being responsive to the receipt of a column address corresponding to the column address of a defective column of memory cells for generating a redundant column decoder signal and a redundant column factor signal;
second programmable redundant decoder means for containing the position of the array of memory cells which contains the defective column of memory cells having at least one defective memory cell;
said second redundant decoder means being responsive to the redundant column decoder signal from said first redundant decoder means for generating an array selection signal; and
redundant energization circuit means connected to said groups of redundant columns of redundant memory cells and responsive to the redundant column factor signal of said first redundant decoder means and to the array selection signal of said second redundant decoder means for generating a signal energizing a selected redundant column of memory cells from said groups of redundant columns of redundant memory cells as a replacement for the defective column of memory cells in the selected array of memory cells.

5. A semiconductor memory device as set forth in claim 4, wherein each of said first and second programmable redundant decoder means includes respective fuse sets defined by a plurality of fuses; and means responsive to the receipt of a column address associated with a defective column of memory cells in one of the plurality of arrays of memory cells for blowing one or more selected fuses in programming said first and second programmable redundant decoder means in a manner identifying any defective columns of memory cells included in the semiconductor memory device and the respective arrays in which a defective column of memory cells occurs.

6. A semiconductor memory device comprising:

a plurality of arrays of memory cells;

each of said arrays of memory cells being arranged in a matrix of rows and columns of individual memory cells;

groups of redundant columns of redundant memory cells corresponding to at least some of said arrays of memory cells;

address generating means for providing an address signal to selectively drive a column of memory cells included in an array of memory cells;

redundant address coincidence circuit means, said redundant address coincidence circuit means including:

a first programmable fuse decoder for receiving an external address signal indicative of a memory cell, a second programmable fuse decoder for receiving the same external address signal indicative of a memory cell as received by said first programmable fuse decoder, said first programmable fuse decoder being responsive to the receipt of a column address corresponding to the column address of a defective column of memory cells, said second programmable fuse decoder for containing the position of the array of memory cells which contains the defective column of memory cells having at least one defective memory cell, said first programmable fuse decoder generating a first address coincidence signal when the external address signal received thereby coincides with a first address of a defective memory cell, said second programmable fuse decoder generating a second address coincidence signal when the external address signal received thereby coincides with a second address of a defective memory cell, and a logic circuit connected to the outputs of said first and second programmable fuse decoders and responsive to the generation of either the first address coincidence signal from said first programmable fuse decoder or the second address coincidence signal from said second programmable fuse decoder for providing a redundant enable signal; and redundant energization circuit means connected to said groups of redundant columns of redundant memory cells and responsive to the redundant column factor signal of said first programmable fuse decoder and to the array selection signal of said second programmable fuse decoder for generating a signal energizing a selected redundant column of memory cells from said groups of redundant columns of redundant memory cells as a replacement for the defective column of memory cells in a selected array of memory cells.

7. A method for starting a redundant memory cell system which replaces a defective memory cell in a semiconductor memory device containing at least one array of memory cells arranged in a matrix of rows and columns of individual memory cells and in which a respective memory cell is accessed from the semiconductor memory device upon receiving row and column address signals, said method comprising:

providing programmed addresses of defective memory cells in a redundant decoder;

directing an external address signal corresponding to at least one of the row and column memory address signals to the redundant decoder;

outputting an address coincidence signal from the redundant decoder when the external address indicated by said one memory address signal and an address of a defective memory cell in the redundant decoder are in agreement;

outputting an address uncoincidence signal when the external address indicated by said one memory address signal and the address of a defective memory cell in the redundant decoder are not in agreement;

energizing a redundant group of a row and column of redundant memory cells and making one of the redundant row and column groups of memory cells inactive in response to a logic signal indicative of the address coincidence signal and the address uncoincidence signal respectively; and energizing one of the lines of redundant memory cells of one of a row and column of redundant memory groups selected and rendering the other of the lines of memory cells included in said one of the row and column of redundant groups inactive in response to the external address.

* * * * *